United States Patent
Schmidig et al.

(10) Patent No.: US 9,726,735 B2
(45) Date of Patent: Aug. 8, 2017

(54) NMR PROBE HEAD WITH IMPROVED CENTERING OF THE SAMPLE VIAL

(71) Applicant: BRUKER BIOSPIN AG, Faellanden (CH)

(72) Inventors: Daniel Schmidig, Schaffhausen (CH); Danijela Al Adwan Stojilkovic, Faellanden (CH); Dirk Wilhelm, Maur (CH)

(73) Assignee: Bruker BioSpin AG, Faellanden (CH)

( * ) Notice: Subject to any disclaimer, the term of this patent is extended or adjusted under 35 U.S.C. 154(b) by 535 days.

(21) Appl. No.: 14/306,320

(22) Filed: Jun. 17, 2014

(65) Prior Publication Data

US 2015/0002152 A1    Jan. 1, 2015

(30) Foreign Application Priority Data

Jun. 26, 2013  (DE) .................. 10 2013 212 312

(51) Int. Cl.
 *G01R 33/30* (2006.01)
(52) U.S. Cl.
 CPC .................. *G01R 33/307* (2013.01)
(58) Field of Classification Search
 CPC .... G01R 33/30; G01R 33/3007; G01R 33/31; G01R 33/34023; H04B 7/022; H04J 3/0685; G01N 24/08
 See application file for complete search history.

(56) References Cited

U.S. PATENT DOCUMENTS

| 3,525,928 | A | | 8/1970 | Nagao | |
|---|---|---|---|---|---|
| 5,192,910 | A | * | 3/1993 | Hepp | ........................ B01L 7/00 324/315 |
| 5,408,181 | A | * | 4/1995 | Dechene | .............. G01N 24/085 324/300 |
| 6,177,798 | B1 | | 1/2001 | Haner | |
| 6,396,274 | B1 | | 5/2002 | Commens | |
| 6,466,019 | B2 | | 10/2002 | Marek | |
| 6,563,317 | B2 | | 5/2003 | Warden | |
| 2002/0135372 | A1 | * | 9/2002 | Warden | .................. G01R 33/30 324/321 |
| 2002/0196022 | A1 | | 12/2002 | Tschirky | |
| 2002/0196023 | A1 | * | 12/2002 | Hofmann | ............... G01R 33/30 324/321 |

(Continued)

FOREIGN PATENT DOCUMENTS

JP      2007147312       6/2007

*Primary Examiner* — Clayton E Laballe
*Assistant Examiner* — Ruifeng Pu
(74) *Attorney, Agent, or Firm* — Paul Vincent

(57) ABSTRACT

An NMR probe head (3) has a coil system (9) and a radial centering mechanism for a sample vial (4) having two centering devices spaced axially from each other to center the sample vial in the radial direction only. The first centering device (5) is disposed above the receiver coil system and at least one further centering device (6) is disposed axially above the coil system with an axial spacing (d) above the first centering device. The first and second centering devices restrict the radial scope for movement of the sample vial to such an extent that the sample vial cannot touch an endangered space (7) during the entire duration of transport of the sample vial to its measuring position, thereby precluding damage to the probe head components in the endangered space by the sample vial.

23 Claims, 14 Drawing Sheets

(56) References Cited

U.S. PATENT DOCUMENTS

| | | | |
|---|---|---|---|
| 2003/0098689 A1* | 5/2003 | Marek | G01R 33/34061 324/318 |
| 2003/0231019 A1 | 12/2003 | Fey | |
| 2006/0119359 A1* | 6/2006 | Hasegawa | G01R 33/34069 324/318 |
| 2008/0179275 A1* | 7/2008 | Himmelsbach | G01R 33/30 215/341 |
| 2008/0204026 A1* | 8/2008 | Tsuchiya | G01R 33/28 324/321 |
| 2008/0278166 A1* | 11/2008 | Wosik | G01R 33/34007 324/318 |
| 2008/0290869 A1* | 11/2008 | Hutton | G01R 33/30 324/318 |
| 2009/0322333 A1* | 12/2009 | Miki | G01R 33/3403 324/318 |
| 2010/0171495 A1* | 7/2010 | Bovier | G01R 33/30 324/309 |
| 2011/0284192 A1* | 11/2011 | Grossniklaus | G01R 33/31 165/135 |
| 2013/0088232 A1* | 4/2013 | Inukai | G01N 24/08 324/321 |
| 2014/0091800 A1* | 4/2014 | Fordham | G01R 33/305 324/321 |
| 2014/0167756 A1* | 6/2014 | Cho | G01R 33/30 324/309 |
| 2014/0253124 A1* | 9/2014 | Baumann | G01R 33/34 324/322 |
| 2015/0002155 A1* | 1/2015 | Webber | G01R 33/31 324/322 |
| 2016/0033599 A1* | 2/2016 | Song | G01N 24/08 324/309 |

* cited by examiner

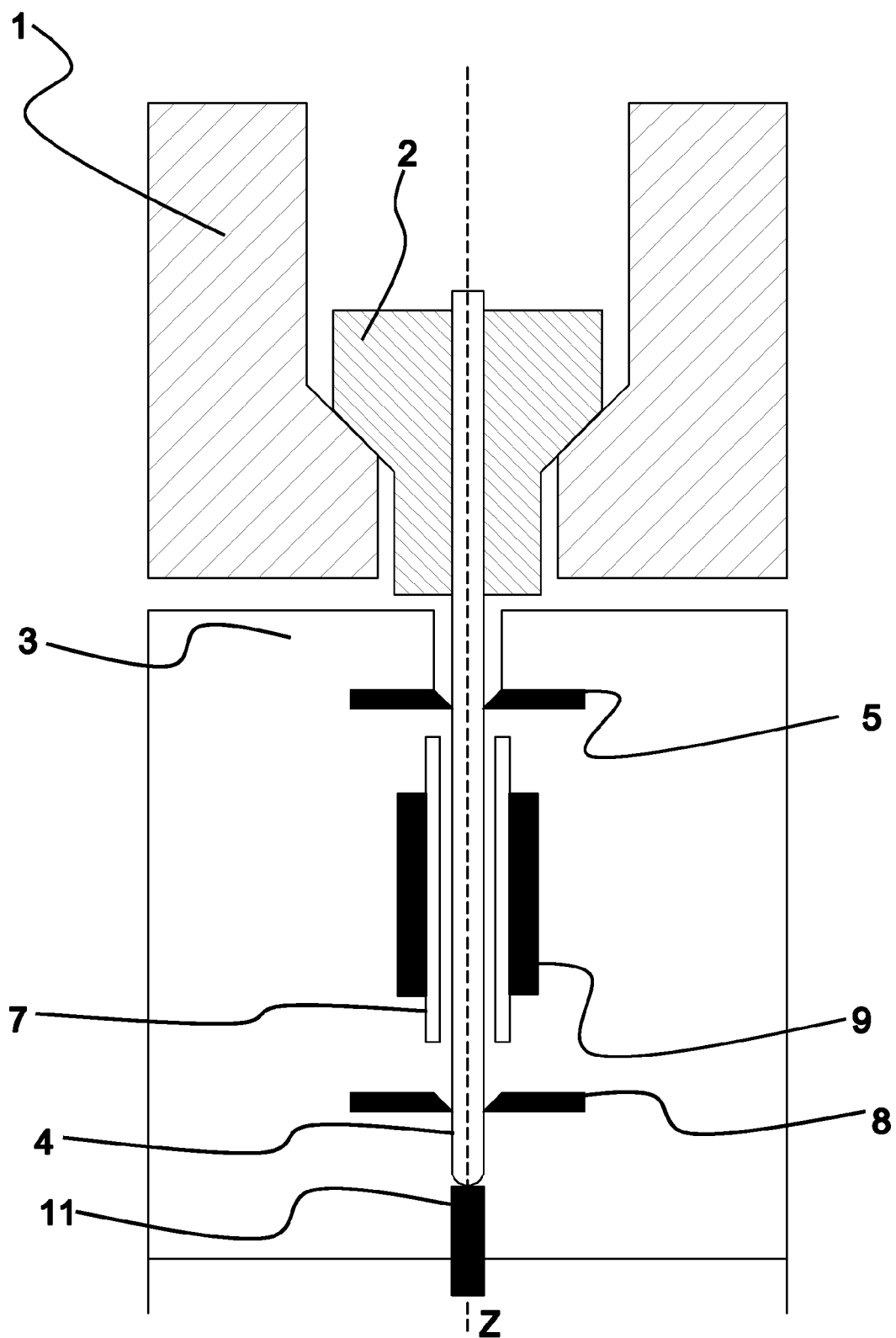
Fig. 2a                    PRIOR ART

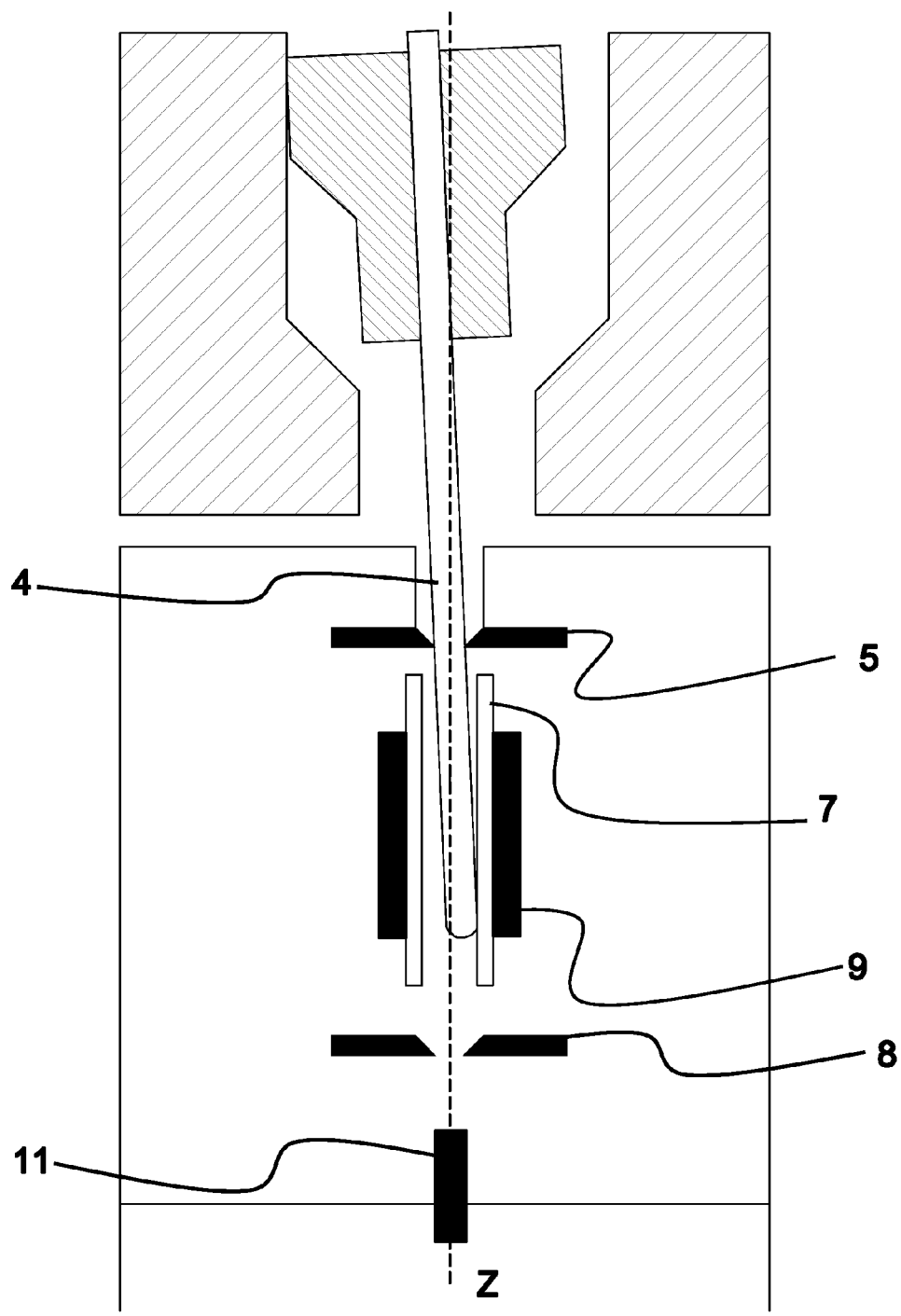
Fig. 2b  PRIOR ART (Problem)

NMR PROBE HEAD WITH IMPROVED CENTERING OF THE SAMPLE VIAL

This application claims Paris convention priority from DE 10 2013 212 312.4 filed Jun. 26, 2013 the entire disclosure of which is hereby incorporated by reference.

BACKGROUND OF THE INVENTION

The invention relates to an NMR(=nuclear magnetic resonance) probe head with an NMR coil system disposed around a preferably vertical z axis and a device for the radial centering relative to the z axis of a longitudinal sample vial closed at one end and filled with a substance to be measured, wherein the NMR coil system is fixed radially relative to the NMR probe head with respect to the z axis, wherein at least two centering devices are provided spaced from each other in the axial direction of the z axis with passage openings for the sample vial for the centering of the sample vial in the radial direction only, of which at least a first centering device is disposed in the z direction above the NMR coil system, and wherein all centering devices are fixed radially with respect to the z axis.

Such an assembly is known, for example, from U.S. Pat. No. 6,563,317 B2 (=Reference [1]).

NMR spectroscopy is a powerful process of instrumental analysis. RF (radio-frequency) pulses are irradiated into a measurement sample, which is located in a strong, static magnetic field, and the RF response of the sample is measured. By this means, the information is retrieved integrally across a specific region of the measurement sample, the so-called active volume.

As a rule, the measurement sample consists of a cylindrical sample vial that contains the solid or liquid substance to be measured. The vial can have a circular, oval, or rectangular cross section. It is closed at least at the end with which it first enters the probe head. The closed end is typically rounded.

Typically, the sample vial is located in a spinner. It can either be permanently connected to the spinner or positioned freely in the spinner. The sample vial and the spinner are transported from outside the magnet into the probe head by means of a transport system. In the description below, it will be assumed that the insertion opening is located at the top of the probe head and that the sample vial is inserted into the probe head from above. However, it is also conceivable to insert the sample vial into the probe head from below into an opening intended for that purpose. This case is analogous to that described above and, for the sake of clarity, will not be explicitly described. If the sample vial is in the measuring position, the spinner is located inside the turbine. The sample vial can be rotated by means of the turbine.

In the measuring position, the sample vial is surrounded by one or more NMR coils. The innermost NMR coil has an inside diameter that is only slightly larger than the outside diameter of the measuring probe because the fill factor and thus the sensitivity of the NMR coil depends on the inside diameter and is reduced as the inside diameter increases.

Various fragile probe head components can be disposed around the sample vial when it is in the measuring position. This might, for example, be the innermost NMR coil or also a glass tube that holds the innermost NMR coil. Defined in general terms, we refer to an endangered region around the sample vial in the measuring position. During transport of the sample vial into the measuring position, collision with such fragile components, which are located in the endangered region, usually results in time-consuming repair of the probe head.

In reference [1], the sample vial is centered in the measuring position by two centering devices with a radial action, which are disposed axially above and below the coil. The centering devices are rigidly connected to the holder device of the receiver coil. In addition, positioning is provided in the axial direction only. This can be performed either below the receiver coil by means of an end stop or above the receiver coil inside a modified spinner with the aid of a fastening sleeve.

The centering devices of the prior art (see references [1] and [2] including the sources cited therein) are solely concerned with ensuring that the position of the sample vial is controlled precisely and reliably in the measuring position. However, precise guidance of the sample vial is not achieved all the time during transport into the measuring position. If the sample vial is still located above the measuring position, the lower end of the sample vial, in particular, can move radially a relatively large distance away from the probe head axis. As a result, the components of the probe head that are located in an endangered region may be damaged during transport into the measuring position.

Even a slight probability of such damage occurring during insertion of the sample vial into the probe head is very disadvantageous if the NMR spectrometer is operated as a high-throughput analytical system. Using automatic sample vial changers and filling robots it is namely possible to perform a large number of measurements on different samples in a very short time. In this case, even the combination of a slight probability of damage and a large number of sample changes can result in an unacceptable failure rate.

The object of this invention is therefore to modify an NMR probe head of the type defined above using as simple technical measures as possible, so that the disadvantages given above are largely eliminated, wherein the transport of the sample vial from entry into the probe head until it reaches the measuring position can be controlled in such a way that probe head components cannot be damaged by the sample vial in an endangered region inside the probe head.

In order to keep down tines as low as possible, in particular, when using an automatic sample vial changer, a very high degree of safety during the individual operations is sought. Contact by the sample vial with the probe head in the endangered region must therefore be fully excluded with certainty.

Another object of this invention is to permit fast exchange of the sample vial without risking any considerable reduction in the lifetime of the probe head.

SUMMARY OF THE INVENTION

This complex object is achieved in a manner that is surprisingly simple and effective, in that for a generic NMR probe head with the characteristics defined above, at least one further centering device is disposed axially above the NMR coil system and either above or below the first centering device, so that the axial spacing between the two centering devices is chosen and the size as well as the geometric shape of the passage openings in the centering devices are designed such that the first centering device, in its interaction with the further centering device, restricts the radial scope for movement of the sample vial relative to the z axis to such an extent, that the sample vial cannot touch a predefined hollow cylindrical space, which extends axially with respect to the z axis in the region of the NMR coil system and possibly also extends above and/or below the latter, as well as radially at least partially within the NMR coil system (and which hereinafter will sometimes also be termed "endangered region"), during the entire duration of transport of the sample vial into its measuring position in the NMR probe head, wherein the further centering device is mechanically connected to the NMR probe head.

The inventive NMR probe head has a system of guides that comprises at least two positioning facilities with radial action, which are located between the insertion opening of the NMR probe head and the magnetic center, wherein the guides with radial action are sufficiently far enough apart in the z direction and restrict the radial scope for movement of the sample vial to such a degree that the sample vial cannot touch the endangered region throughout the transport operation of the sample vial into the measuring position. Both of the radial guides also center the sample vial in the measuring position. The effect of centering in the measuring position can be supplemented by further radial positioning below the coil. However, this additional guidance does not take effect during transport of the sample vial into the measuring position until the end of the procedure. Therefore, it is not used to protect the endangered region but only for centering in the measuring position.

In order to achieve optimal centering of the sample vial, the two radial guides above the NMR coil can be rigidly connected to the holder device of the NMR coil. In this way, tolerances in the relative positioning of the sample vial and the NMR coil can be minimized.

The sample vial is positioned axially either by an end stop below the NMR coil or by the spinner being stopped by the turbine.

The inventive system of guides ensures that the sample vial never touches the endangered region at any time during its transport from outside the magnet into the probe head and finally into the measuring position. This prevents expensive and time-consuming repairs of these sensitive components of the NMR probe heads. At the same time, the inside diameter of the NMR coil can be chosen sufficiently small to optimize the fill factor and thus the NMR sensitivity.

At this point, it is specifically pointed out that although the description of this invention and the patent claims—for reasons of linguistic clarity—always refer to a "vertical z axis" and to axial positions "above" or "below" the NMR coil system, the advantages of the invention can be achieved equally with NMR systems with a horizontal or oblique z axis. The specified axial positions then no longer necessarily have to be "above" or "below" the NMR coil system but may be to the "right" or "left" thereof. In any case, gravity only plays a minor role in the working principle of this invention.

In an advantageous class of embodiments of the inventive NMR probe head, in the hollow cylindrical space, a cylindrical tube is disposed that surrounds the sample vial in its measuring position. The cylindrical tube serves as a holder for the radially innermost NMR coil. It typically consists of a good electrical insulator, which generates low losses for radio-frequency currents (e.g. ceramic glass, PEEK, silica glass, sapphire.). In order to achieve the highest possible fill factor and thus a high signal-to-noise ratio (=SNR), an inside diameter of the NMR coil is chosen that is only slightly larger than the outside diameter of the sample vial. It is therefore an advantage if the cylindrical tube has a smallest possible wall thickness. However, the wall thickness considerably influences the strength of the cylindrical tube, so that thin tubes are extremely susceptible to collision with the sample vial. With its two radial guides, the inventive configuration ensures that the sample vial never touches the cylindrical tube during insertion into the measuring position. This precludes damage to the cylindrical tube. Consequently, time-consuming and expensive repairs to the probe head are avoided.

A class of alternative embodiments is especially preferred in which the radially innermost NMR coil of the NMR coil system with respect to the z axis and/or a holder structure for this innermost NMR coil is/are disposed inside the hollow cylindrical space. In this configuration, the inside diameter of the NMR coil is smaller than in a configuration with a cylindrical tube. Thus, the fill factor and ultimately the SNR is higher than in the case described above. Because the NMR coil is a very complex, expensive, and sensitive part of the probe head, the protection of this coil against collisions with the coil tube has upmost priority. This is achieved with the inventive guides. Because the radial centering devices are disposed in such a way that contact between the sample vial and the innermost NMR coil is precluded.

In preferred further variants of this class of embodiment, the holder structure for the innermost NMR coil is disposed in the hollow cylindrical space, and the first centering device extends at least partially radially between the holder structure and the sample vial in its measuring position. By disposing the first centering device inside the holder structure, a very tight inside diameter of the centering device is achieved. The tighter the inside diameter of the centering device, the more precisely the sample vial can be guided radially. Together with the second centering device, extremely precise guidance of the sample vial during insertion into the measuring position is achieved, which, in turn, prevents the sample vial from touching the holder structure of the innermost NMR coil.

An embodiment of the inventive NMR probe head is also preferred, which is characterized in that at least one centering device is geometrically designed in its cross section such that a temperature-control gas can flow between the sample vial in its measuring position and the centering devices, wherein the temperature-control gas flow through the centering devices, in a cross-sectional plane perpendicular to the z axis, is blocked by no more than 70% in total. Optimum temperature control of the sample vial is achieved with a temperature-control gas flow that flows directly along the surface of the sample vial. However, the centering device should have an inside diameter that is as small as possible in order to achieve optimum guidance. The centering device, if it is positioned close to the sample vial with a small diameter, therefore blocks the temperature-control gas flow. This blocking should not be excessively large so that the flow resistance and thus the pressure loss can be kept low.

In a further variant of this and/or of the previously described embodiment, the first centering device comprises a radial inner guide, a cylindrical tube that preferably functions as RF (=high frequency) shielding and an upper end stop edge to rest on the upper end face of a cylindrical coil glass. This results in a dual function of RF shielding and centering device, with the advantage that the number of required parts can be reduced, thus saving costs.

In further advantageous variants, the first centering device is equipped with multiple radial cutouts extending in the axial direction along the z axis in a radially inner guide and/or with slots disposed along the z direction. The cutouts or slots allow the temperature-control gas to flow along the sample vial through the inner guide. They can be chosen such that the blocking and thus the flow resistance is sufficiently small, which ultimately results in efficient temperature control of the sample vial.

These variants can be further developed so that raised cams are provided on bars between the slots in the radial direction, those raised cams being dimensioned in such a way that the first centering device is clamped in the radial direction when it is inserted into the holder structure for the radially innermost NMR coil of the NMR coil system with respect to the z axis. Thus, a tight connection of the first centering device with the holder structure is achieved. Because the holder structure directly supports the receiver coil, advantageous centering of the sample vial relative to the receiver coil is effected. Moreover, the radial clamping in the holder structure can prevent the displacement or twisting of the centering device under the influence of the temperature-control gas flow.

A further preferred embodiment of the inventive NMR probe head is characterized in that a third centering device is disposed with an axial spacing in the z direction above the first centering device and below the further centering device. With a third centering device, the sample vial can be guided right up to the measuring position with the greatest possible precision throughout the entire insertion procedure.

Further preferred embodiments of the invention are characterized in that at least one centering device is disposed axially below the NMR coil system. This additional centering device with a radial action comes into play after the sample vial has been inserted into the measuring position. It causes the sample vial to be very well guided radially in the measuring position.

In further advantageous embodiments, at least one positioning device is provided for axial positioning of the sample vial, which in the operating position can be either below or above the NMR coil system.

These embodiments can be further developed so that the positioning device is disposed axially below the NMR coil system and comprises an end stop part on which the sample vial rests in the measuring position. The radial centering devices must be supplemented by axial centering, which is provided either by the spinner abutting against the turbine or by axial centering below the NMR coil. By means of the axial centering, due to its spatial proximity to the NMR coil, the sample vial can be very precisely positioned with respect to the magnetic center of the NMR coil in the Z direction. This is important for ensuring that the magnetic field of the NMR coil coincides with the relevant region of the sample vial, the relevant region being the region in which the NMR signals are acquired. It is termed the "active sample volume."

Embodiments of the inventive NMR probe head are also advantageous in which the first centering device and the further centering device and possibly a centering device disposed axially below the NMR coil system are mechanically rigidly connected to each other, in particular, with connecting elements and/or by means of fixture to a holder structure for the receiver coil system. The tolerances between the individual parts, namely the holder structure, the receiver coil, and the centering device are easy to control with the rigid connection. In this way, very good centering of the sample vial relative to the receiver coil can be achieved.

A further preferred class of embodiments of the invention is characterized in that the first centering device and/or the further centering device has a funnel-shaped passage opening to receive the sample vial. The funnel shape efficiently guides the sample vial when it initially enters the respective centering devices.

In practice, embodiments of the inventive NMR probe head have proven particularly suitable in which the axial spacing between the first centering device and the radially innermost NMR coil of the NMR coil system with respect to the z axis is smaller than twice the radial diameter of the sample vial. The smaller the distance between the first centering device and the NMR coil, the more precisely the sample vial can be guided in the radial direction.

Another particularly advantageous class of embodiments of the invention is characterized in that exactly one first centering device and exactly one further centering device are located axially above the NMR receiver coil system, wherein the regions of the centering devices by which the sample vial is effectively guided in the z direction each have an axial extent of 0.05D to 0.6D, wherein D is the radial diameter of the sample vial. The region within which the end of the sample vial can move away from the desired position during transport is determined by the axial spacing between both centering devices and their precision, but not by the length of the guide of the individual centering devices. It is therefore advantageous to keep the axial extent of these guides small in order, for example, to reduce the resistance for the temperature-control gas flowing between the centering device and the sample vial.

In further advantageous embodiments, at least one of the centering devices disposed axially above the NMR coil system is manufactured from a material, which has a hardness that is substantially less than the hardness of the materials from which the sample vial is manufactured, in particular, less than the hardness of borosilicate glass or fused silica. Because the sample vial touches the guiding devices while being inserted into the measuring position, a material that is softer than the sample vial material is preferred. This prevents the sample vial from being damaged when it abuts against the guiding devices. Because the sample vial exercises an axial movement along the centering device when it is being introduced into the measuring position, there is also a danger of scratching occurring on the sample vial. This danger is avoided by choosing a material with a lower hardness than that of the sample vial.

Embodiments are also advantageous in which at least one of the centering devices disposed axially above the NMR coil system is made of a material whose surface exhibits a conductivity of $>10^7$ S/m. This high conductivity of the centering device allows the centering device to be additionally used for RF shielding. RF shielding is important for guiding the magnetic fields of the NMR coil and limiting them in the Z direction. This dual function of the inventive component results in significant savings in the production costs of the probe heads.

An embodiment of the inventive NMR probe head is especially preferred in which at least one of the centering devices disposed axially above the NMR coil system has an axial length of at least one diameter D of the sample vial and is positioned at an axial distance from the innermost NMR coil of the NMR coil system with respect to the z axis, which is smaller than the radial coil diameter of the innermost NMR coil. Here, the axial distance of the positioning facility from the radially innermost NMR coil is kept as small as possible in order to achieve good radial guidance of the sample vial.

Advantageous further variants of these two embodiments described above are characterized in that the centering devices make RF electrical contact with an RF shielding tube of the NMR probe head. Contact between the electrically conducting centering device and the probe head mass, which is formed by the shielding tube, permits improved shielding of the probe head against RF interference signals penetrating from the outside.

Alternatively or additionally in other variants, the centering devices can be shaped such that no path exists within the centering devices that surrounds the sample vial when it is in its measuring position. This variant can be formed, for example, by a hollow cylindrical structure with a slot in the axial direction along the surface contour. Frequently, in NMR experiments, gradient fields are applied over the active volume. These are variable magnetic fields, which are frequently inhomogeneous in the z direction and which are superimposed on the static $B0$ field. In conducting structures, undesirable currents are induced by these gradient fields. Because conductor loops perpendicular to these gradient fields are now prevented, a large proportion of these currents is also suppressed.

Embodiments of the inventive NMR probe head are also advantageous in which at least one of the centering devices disposed axially above the NMR coil system consists of a material that has a conductivity of $<10^{-8}$ S/m. It is an advantage if the first centering device is made of the same insulating material as the holder structure for the NMR coils. The centering device and the holder structure can then be manufactured in a single work step, which results in significant cost savings. This type of design is particularly advantageous if no RF shielding is intended in the proximity of the radially innermost NMR coil.

Embodiments of the invention are equally advantageous in which at least one of the centering devices disposed axially above the NMR coil system is made of a material that exhibits magnetic susceptibility of the magnitude <1.0 ppm. For NMR spectroscopy, even local distortions of the magnetic field in the range of one part per million (1 ppm) of the magnetic field strength cause interference, which may not be capable of reduction to an acceptable level by shimming. For distortion of the magnetic field, susceptibility of the materials used, the distance to the active volume, and the geometry of the components are decisive. Because the centering devices are located in the vicinity of the NMR receiver coil, the susceptibility values directly influence the quality of the NMR signals. The larger the susceptibility values, the greater the interference on the NMR signals. That is why low susceptibility values of the centering devices are preferred.

Finally, a further special embodiment of the inventive NMR probe head is characterized in that the temperature-control gas flowing around the sample vial in at least one of the centering devices does not flow between the centering device and the sample vial, but is guided through air outlet holes offset radially away from the z axis. For example, it is advantageous to guide the temperature-control gas flow through the first centering device that is axially closest to the innermost NMR coil, as this centering device is usually located in the region in which the sample vial is filled with a sample liquid. The second centering device further from the innermost NMR coil is usually located in the region in which the sample vial is filled with a gas. In this region, less transfer of heat between the temperature-control gas flow and the sample occurs. Therefore, no temperature-control gas flow adjacent to the sample vial is required in this region.

The scope of this invention also includes an NMR measurement configuration with an inventive NMR probe head of the type described above, which also comprises an NMR magnet system, a shimming system, a turbine, and a device for transporting a sample vial from outside the NMR magnet system right into the measuring position of the sample vial in the NMR probe head. The inventive centering devices are especially useful in a complete system comprising a probe head, NMR magnet, and transport device, as this combination permits automatic changing of the sample vials, which is very important, for example, for high-throughput NMR applications. The inventive configuration makes an important contribution to these applications as it prevents damage to the probe head when the sample vial is being inserted.

Further advantages result from the description and the drawing. Moreover, the features stated above and further below can be used inventively singly or together in any combination. The embodiments shown and described are not intended to be an exhaustive list, rather are examples illustrating the invention.

The invention is shown in the drawing and is explained in more detail using the embodiments. The figures show:

BRIEF DESCRIPTION OF THE DRAWING

FIG. 1b insertion of the NMR sample vial into the NMR probe head with an inventive centering device according to FIG. 1a;

FIG. 2a a schematic vertical section of the positioning of the NMR sample vial in an NMR probe head according to prior art;

FIG. 2b the insertion of the MMR sample vial into the NMR probe head according to the prior art of FIG. 2a in a schematic vertical section;

DESCRIPTION OF THE PREFERRED EMBODIMENT

The invention is concerned with the damage-free insertion of NMR sample vials into their measuring position in an NMR probe head.

The most frequently used sample vials in NMR are manufactured from borosilicate (glass), are circular cylindrical, and have an outside diameter of 5 mm and an overall length of approx. 7 inches (approx. 18 cm.) The active volume from which the NMR measurement information is extracted is located in the lower third of the vial and usually extends along a length of 25 mm of the sample vial. The active volume is surrounded by NMR coils (more precisely: RF coils), which excite the atoms in this region by means of an excitation field (B1 field) that is orthogonal to the main field (B0 field). In the active volume, the excited atoms emit a weak alternating magnetic field, which is in turn received by suitable NMR coils.

The innermost NMR coil has an inside diameter that is only slightly larger than the outside diameter of the measuring probe because the fill factor and thus the sensitivity of the NMR coil depends on the inside diameter. The sensitivity decreases as the inside diameter increases. In the measuring position, the sample vial is surrounded by an endangered area, which can be constituted by the coil itself or by a holder tube that holds the coil.

NMR vials with further outside diameters, such as 1 mm, 1.7 mm, 8 mm, 10 mm, 15 mm, and 20 mm, are also in use. These have different active volumes from the vial with a 5 mm outside diameter. Besides the circular cylindrical form, other cross sections (e.g. elliptical, rectangular, flattened on one side) are also in common use. The end of the sample vial that is first inserted into the probe head is usually rounded.

Typically, the sample vial is located in a spinner. It can either be permanently connected to the spinner or positioned freely in the spinner. The sample vial is transported from outside the magnet to the measuring position in the probe head by a transport system. If the sample vial is in the measuring position, the spinner is located inside the turbine. The turbine allows the sample vial to be rotated.

In prior art, transport of the sample vial into the measuring position is not continuously controlled. This can cause components to be damaged in the endangered region that surrounds the sample vial in the measuring position, when the sample vial is inserted into the probe head. This results in time-consuming and expensive repairs.

The invention solves this problem by controlling the sample vial during the entire duration of transport from outside the probe head up to the measuring position, so that the sample vial can never touch the endangered region.

The invention is characterized in that at least two guides with a radial action are located above the NMR coils. The radial guides are sufficiently far enough apart from each other in the z direction to prevent the sample vial from touching the endangered area.

Figure 1A:
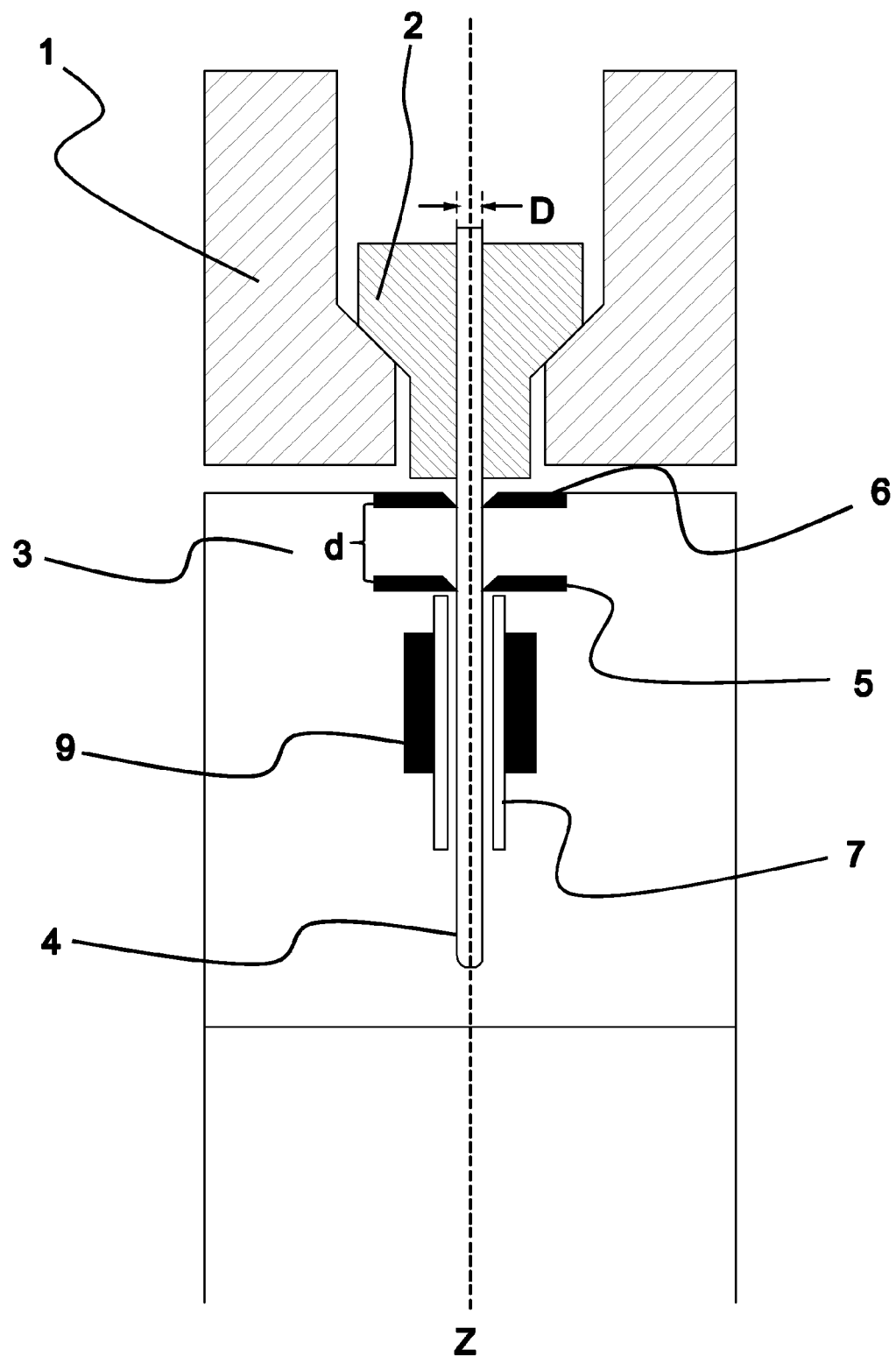
FIG. 1a an embodiment of the inventive centering device for guiding the NMR sample vial in the NMR probe head in a schematic vertical section.

FIG. 1a schematically illustrates an embodiment of the NMR probe head according to this invention as it is described in detail below, with a device for guiding the sample vial.

The sample vial 4 is received in a spinner 2, which rests in a turbine 1 with its oblique outside edge. The sample vial 4 is located in its measuring position in an NMR probe head 3. It is surrounded radially by a predefined hollow cylindrical space 7 (termed "endangered region" below), which is to be protected from collision with the sample vial 4 and resulting damage with the aid of the invention. If, as illustrated in FIG. 1a, the sample vial 4 is located in its measuring position, the system of radial guides with centering devices 5 and 6 that are disposed in the z direction above an NMR coil system 9, centers the sample vial 4.

Figure 1B:
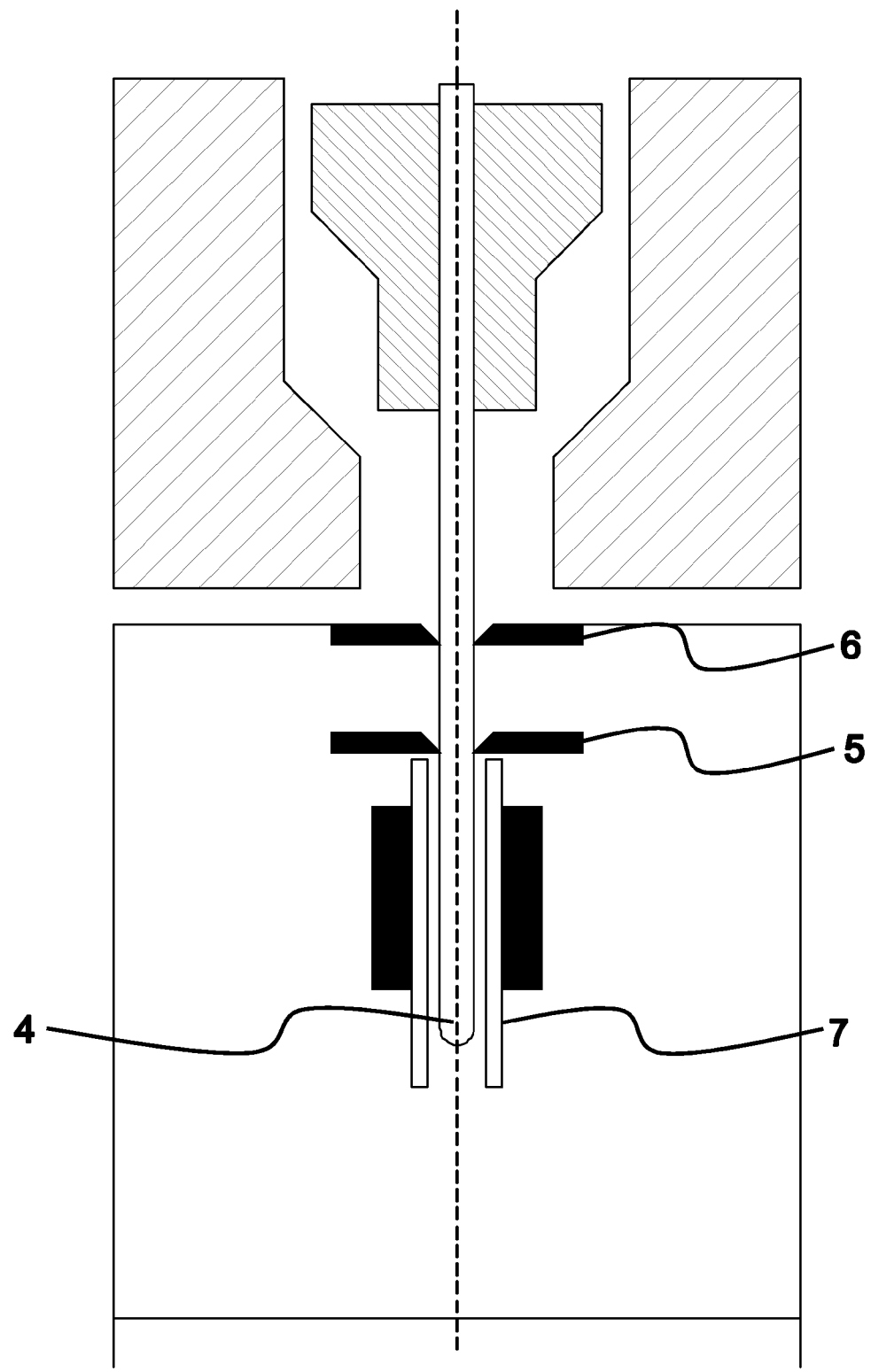

FIG. 1b shows how the sample vial 4 in the inventive configuration is inserted into the probe head. The system of radial guides 5, 6 ensures that the sample vial 4 cannot touch the endangered region 7 when it is inserted.

FIG. 2a shows the prior art, wherein the sample vial 4 is centered radially in the measuring position by the upper centering device 5 and the lower centering device 8. The centering device 8 however does not take effect until the sample vial 4 is already located in the measuring position. The axial positioning is performed by the spinner 2 contacting the turbine 1, wherein the end stop part 11 disposed below the sample vial 4 provides additional safety for its axial stop in its measuring position if no spinner 2 is present.

FIG. 2b shows how the sample vial 4 is inserted into the probe head in prior art. Here, the sample vial 4 can become skewed with respect to the z axis and damage probe head components in the endangered region 7.

Figure 3:
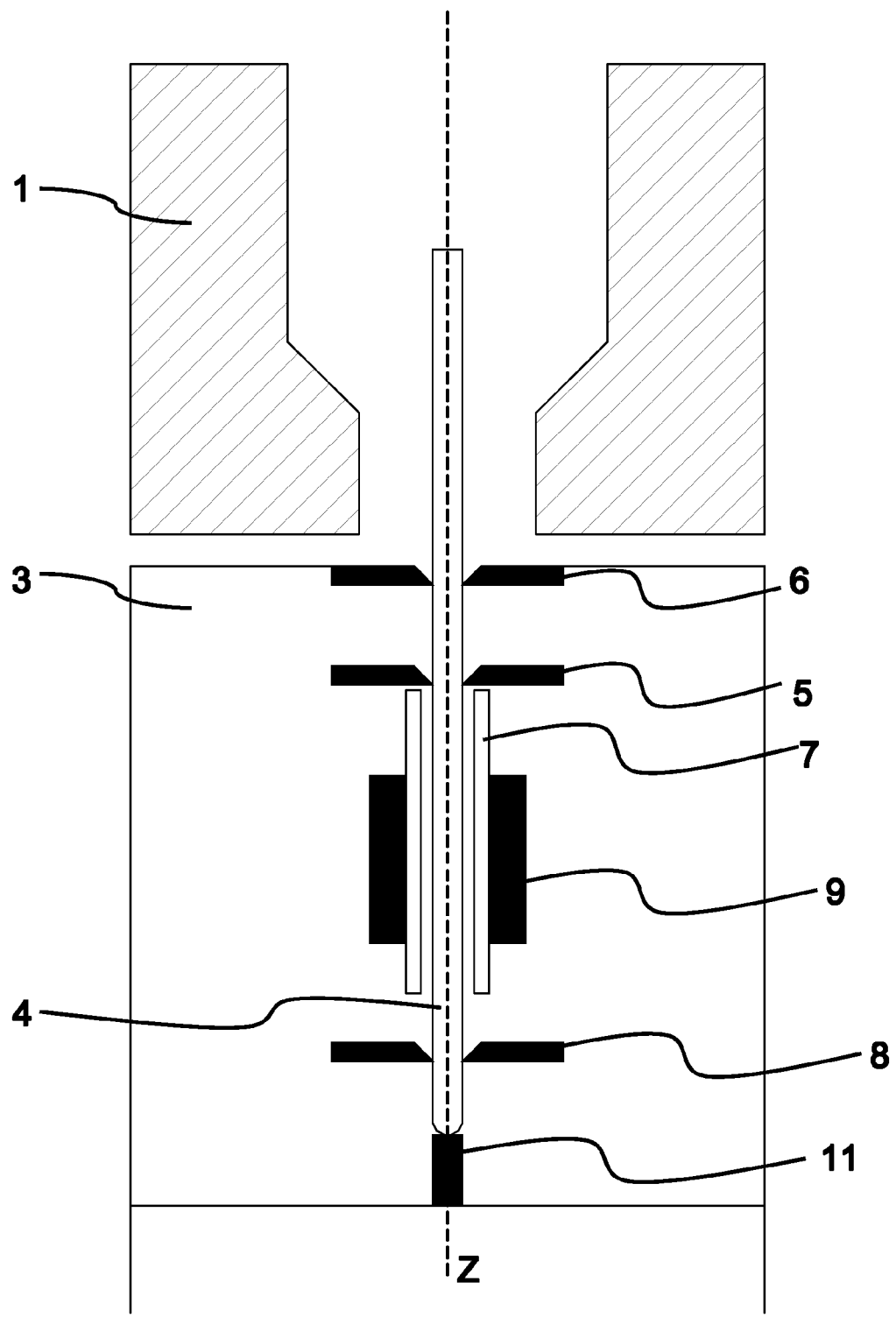
FIG. 3 an embodiment of the inventive NMR probe head, in which the sample vial is guided axially by an end stop and radially by a further centering device located axially below the NMR coil system.

FIG. 3 shows how a sample vial 4 without a spinner in the inventive configuration is guided radially through the guides 5, 6, and additionally through the centering device 8. Here the axial guidance is performed not by the turbine but by the axial end stop 11.

Figure 4:
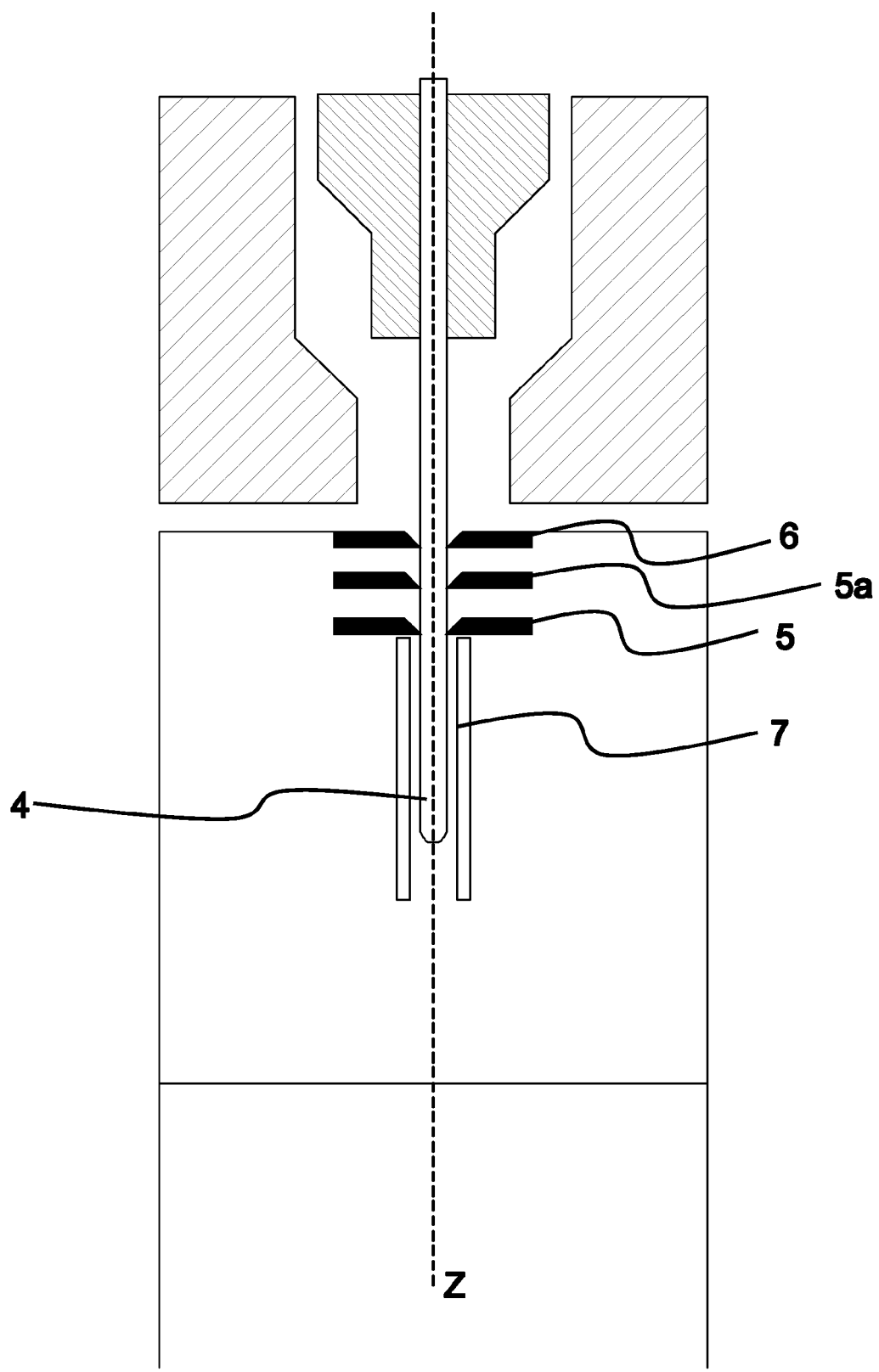
FIG. 4 an embodiment of the inventive NMR probe head, in which the sample vial is guided radially through three centering devices above the NMR coil system.

FIG. 4 shows an inventive system of three guides 5, 5a, 6, with a radial action, which are all located above the endangered region 7. This configuration is advantageous if the spacing between the upper opening of the probe head 4 and the NMR coil is relatively large.

Figure 5:
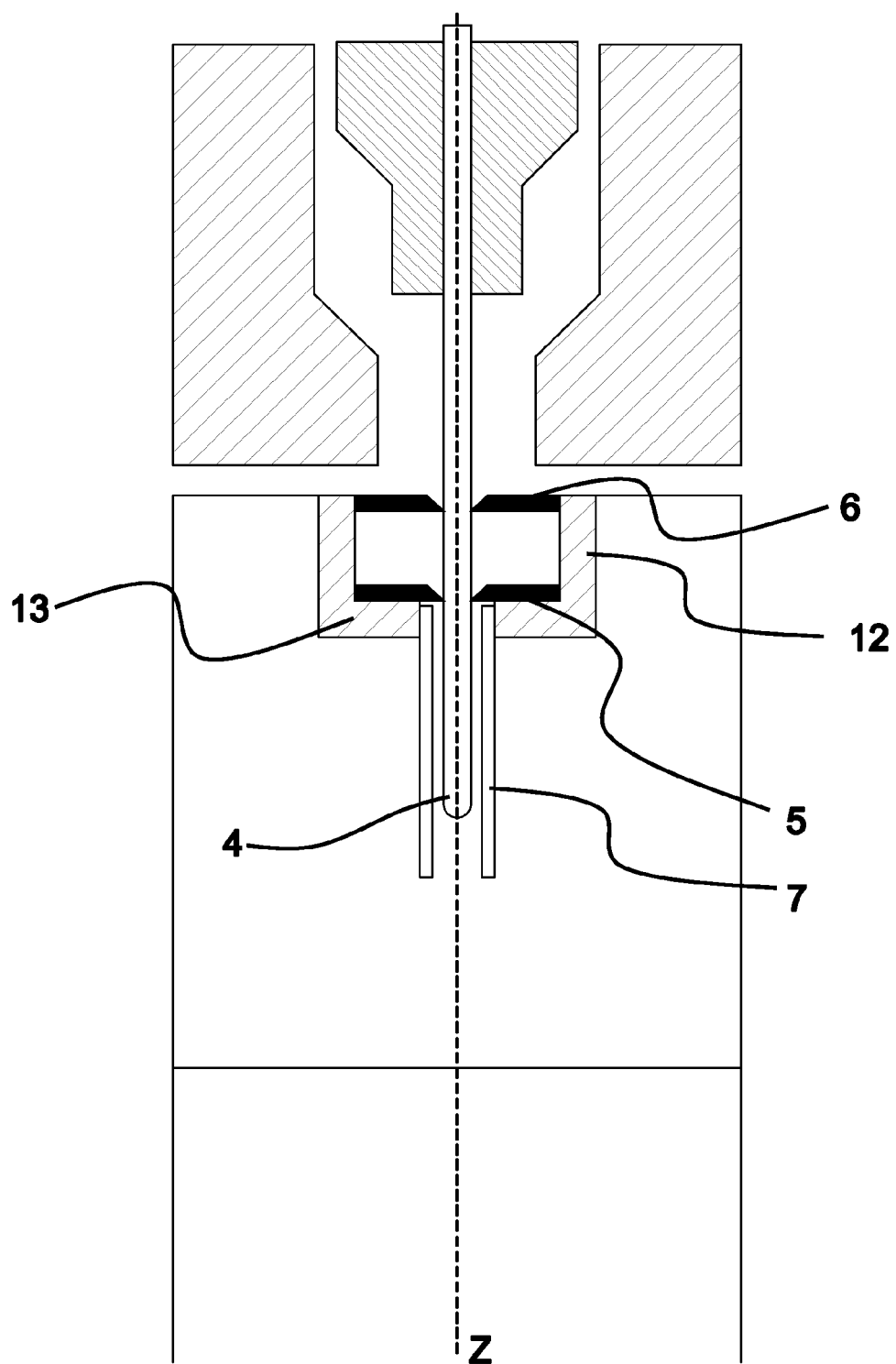
FIG. 5 an embodiment of the inventive NMR probe head in which the upper centering devices are rigidly connected to one another by connecting elements.

In FIG. 5, the upper radial guides 5 and 6 are permanently connected to each other. This is achieved with a connecting element 12. Additionally, the endangered region 7, which, for example, can consist of an NMR coil holder glass, is permanently connected to the connecting element 12 via a further connecting element 13. The connecting elements 12 and 13 can be manufactured from a single part. Combining these parts minimizes the influence of component tolerances. It is also possible to connect a guide permanently with an NMR coil holder glass, in which case the further connecting element 13 can be dispensed with.

Figure 6:
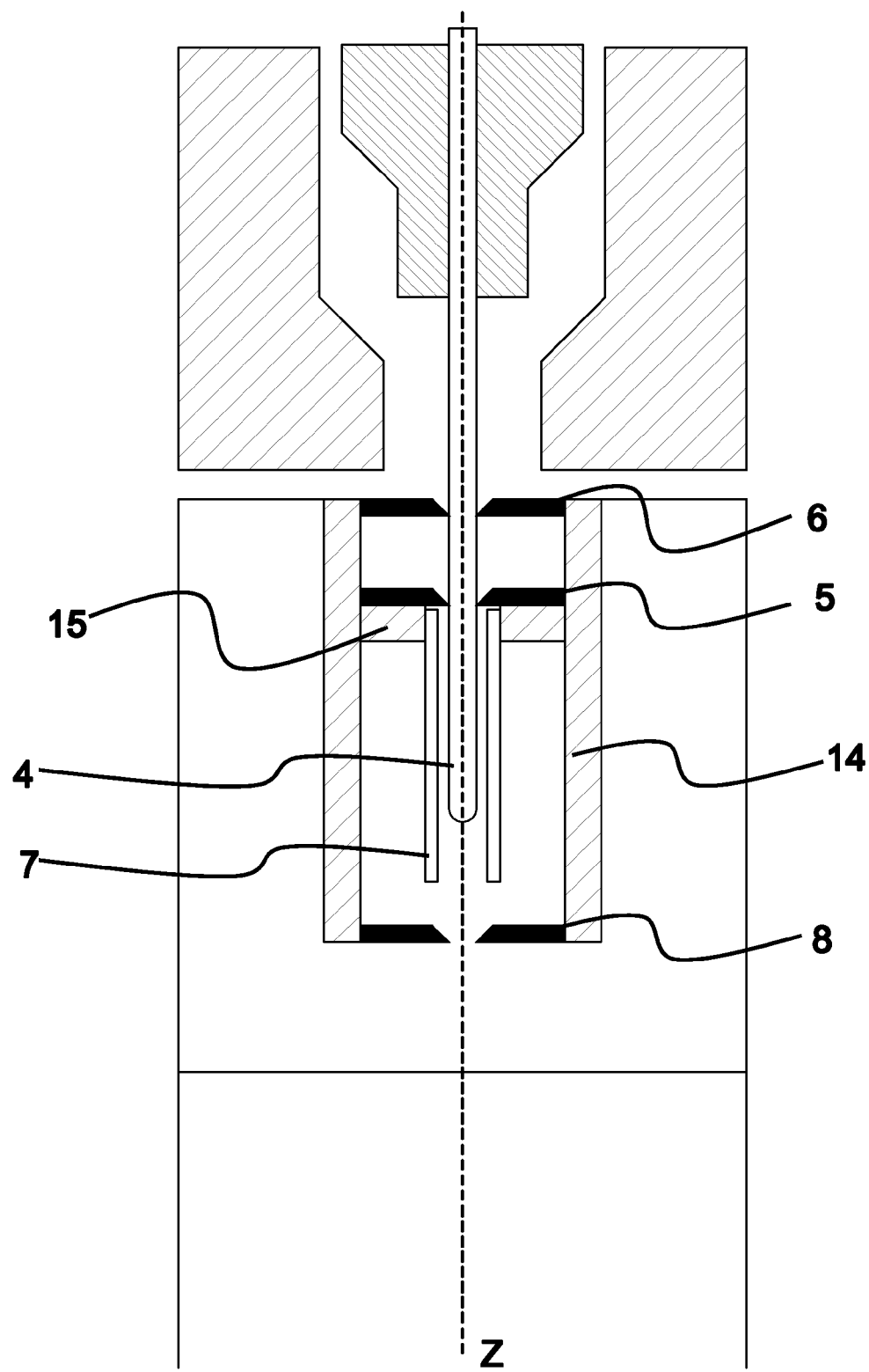
FIG. 6 an embodiment of the inventive NMR probe head in which the upper centering devices and the lower centering device are rigidly connected to one another by connecting elements.

In FIG. 6, the lower centering device 8 is permanently connected axially with the upper guides 5, 6 via a longer connecting element 14. In this case, too, a permanent radial connection 15 with the coil holder glass or the NMR coil is possible.

Figure 7:
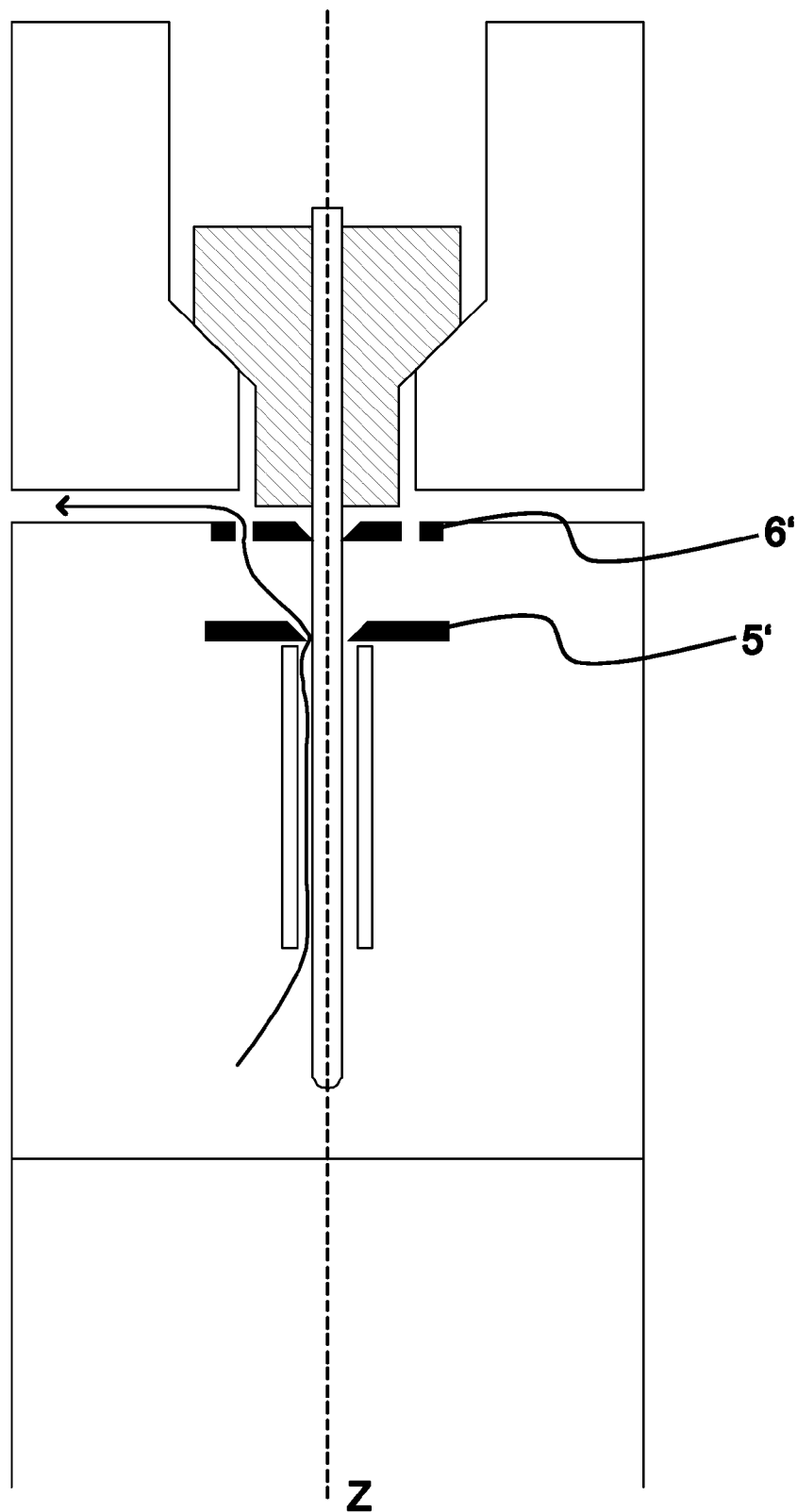
FIG. 7 an embodiment of the inventive NMR head, in which the centering devices are designed such that the temperature-control gas can flow between the sample vial and the centering devices.

FIG. 7 shows how a sample temperature-control gas flow flows past the sample vial 4 through the first centering device 5' and through the further centering device 6'. The characteristics of the upper centering device 6' must be such that they do not unintentionally increase the flow resistance for the temperature-control gas flow. A general description of the temperature control of the sample vial 4 is given, for example, in reference [4] and in publications cited therein.

Figure 8:
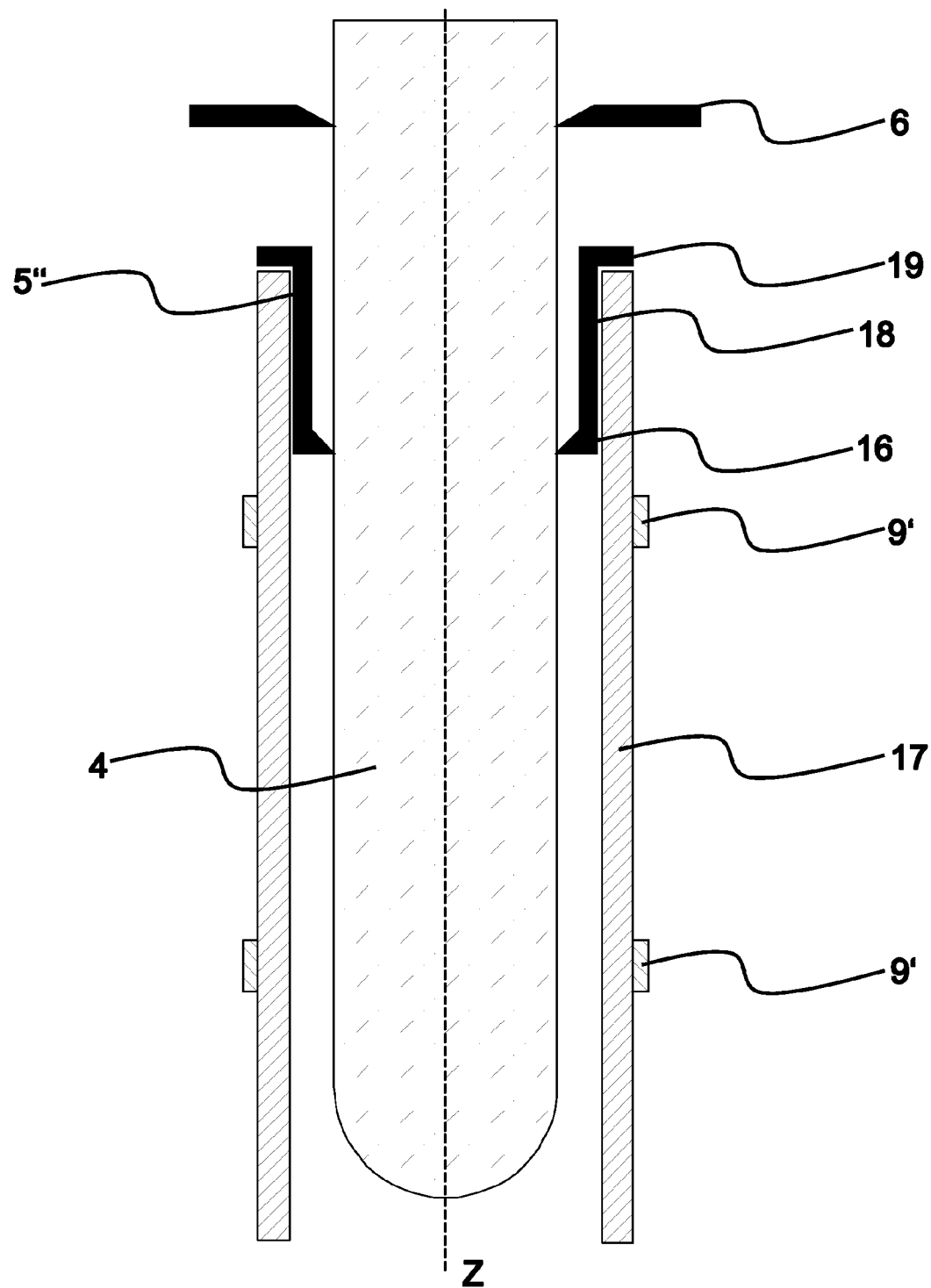
FIG. 8 an embodiment of the inventive centering device in which the centering device closest to the NMR coil is integrated in an RF shielding above the NMR coil.

In FIG. 8, a first centering device 5" with a radially inner guide 16 is disposed directly at the lower end of an RF shielding 18. It is located on the inner side of a coil glass 17, which holds the NMR coil 9'. An upper edge 19 prevents the RF shielding 18 from slipping. In this configuration, a radial guide is permanently connected to the coil glass 17.

Figure 9:
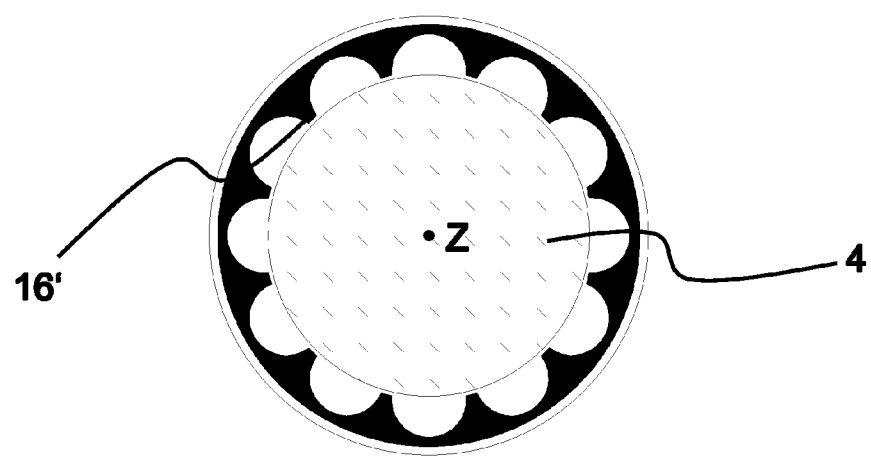
FIG. 9 a schematic cross section through an embodiment of the inventive guide in a plane perpendicular to the z axis, with a geometric form suitable for the flow of temperature-control gas, with multiple radial cutouts extending in the axial direction along the z axis in a radially inner centering device.

FIG. 9 shows a cross section through the sample vial 4 perpendicular to the z axis. The sample via 4 is guided through the guide 16' in the radial direction. The guide 16' has periodically spaced cutouts in the circumferential direction through which the temperature-control gas can flow. The sample vial 4 is guided radially only at the points located on the innermost radius. The cutouts of the centering device 16' are such that the flow is blocked as little as possible.

Figure 10A:
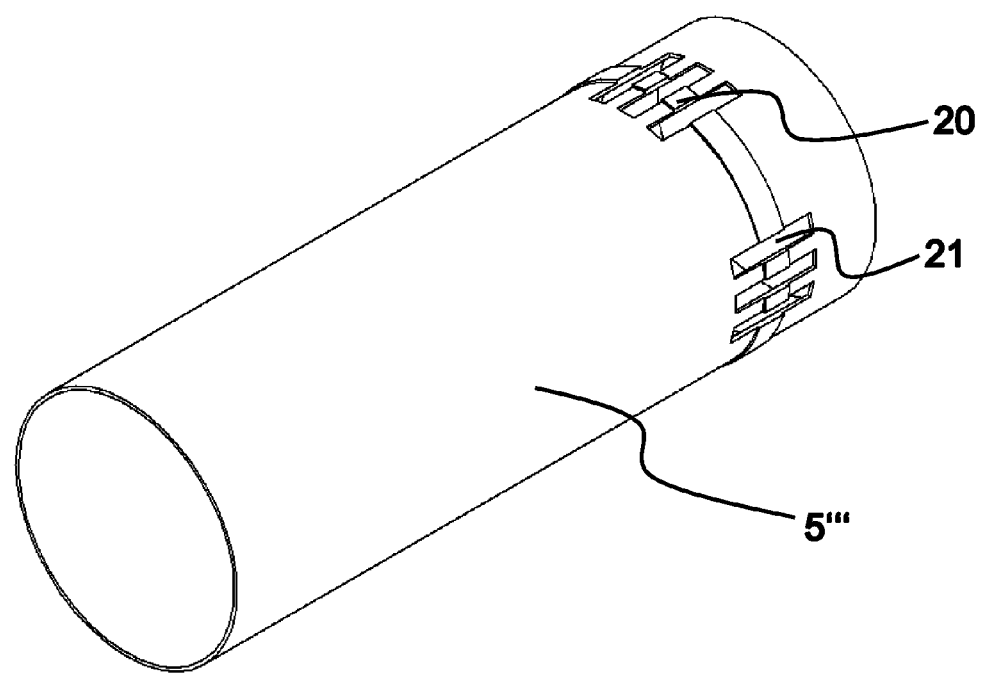
FIG. 10a an embodiment of an inventive centering device with slots disposed along the z direction and raised cams disposed on bars between the slots in the radial direction for clamping on the coil holder structure.

The RF shielding with the first centering device 5''' according to FIG. 10*a* is equipped with cams 20 and slots 21. The cams 20 are slightly raised, i.e. they protrude outward from the RF shielding 18.

Figure 10B:
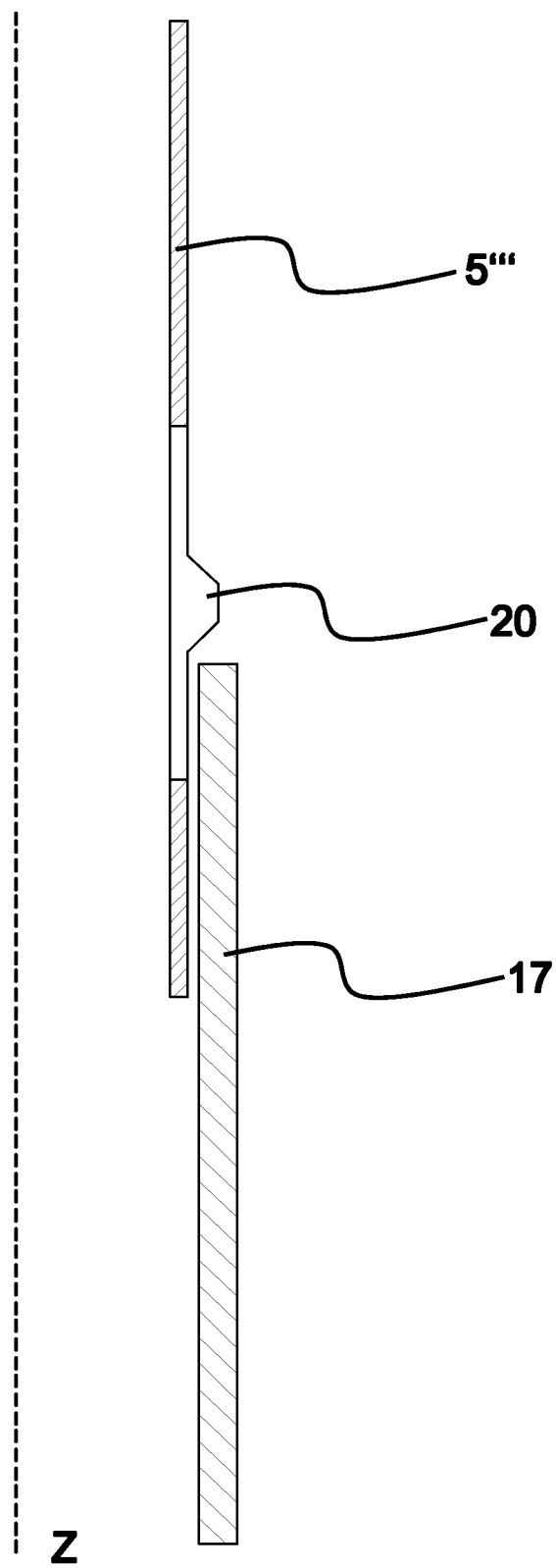
FIG. 10b a schematic vertical section through one half of the embodiment according to FIG. 10a while inserting the centering device onto the coil holder structure.
Figure 10C:
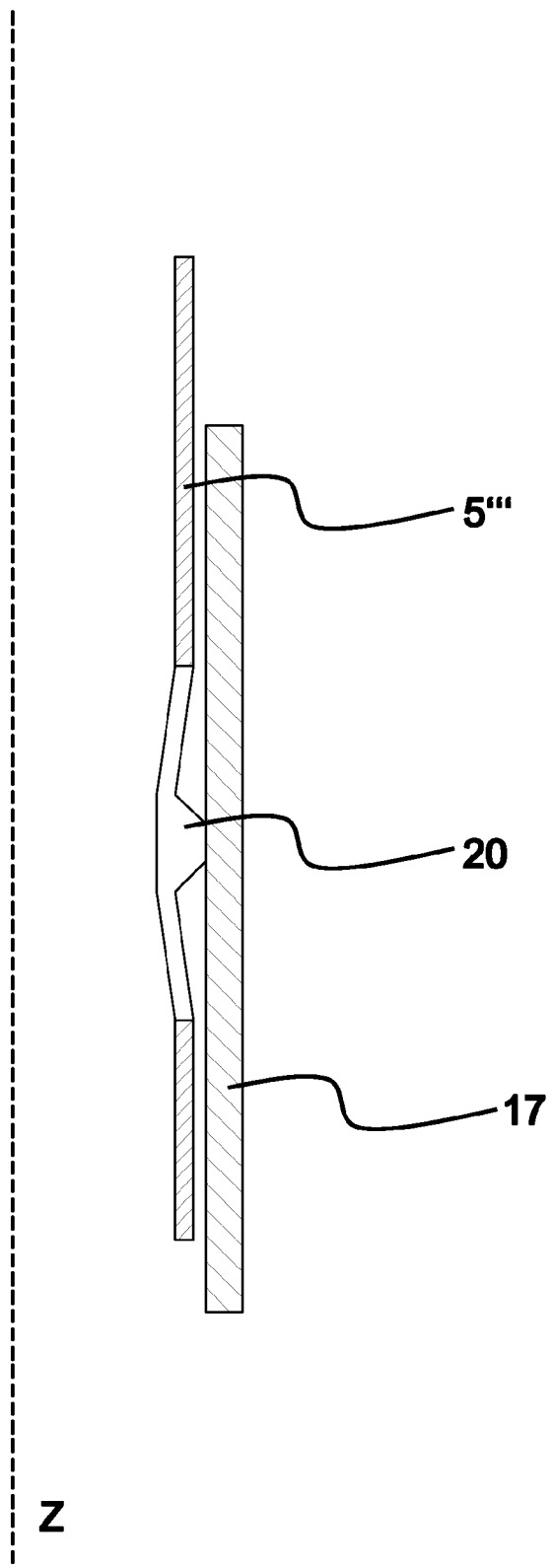
FIG. 10c as for FIG. 10b, but with the guide in its final position on the coil holder structure.

When this RF shielding 18 of the first centering device 5' is inserted into the coil glass 17, as is shown in FIGS. 10*b* and 10*c*, the cams 20 are pressed inward radially. This is made possible by the slots 21. The thickness of the cams 20 and the length and width of the slots 21 can be selected such that the RF shielding 18 can be inserted easily into the coil glass 17 while at the same time fitting sufficiently firmly. The slots 21 should not be too large as otherwise the shielding effect of the RF shielding 18 will be impaired.

FIG. 10*c* shows the RF shielding 18 of the first centering device 5''' with cams 20 in the final position on the coil holder glass 17.

Figure 11:
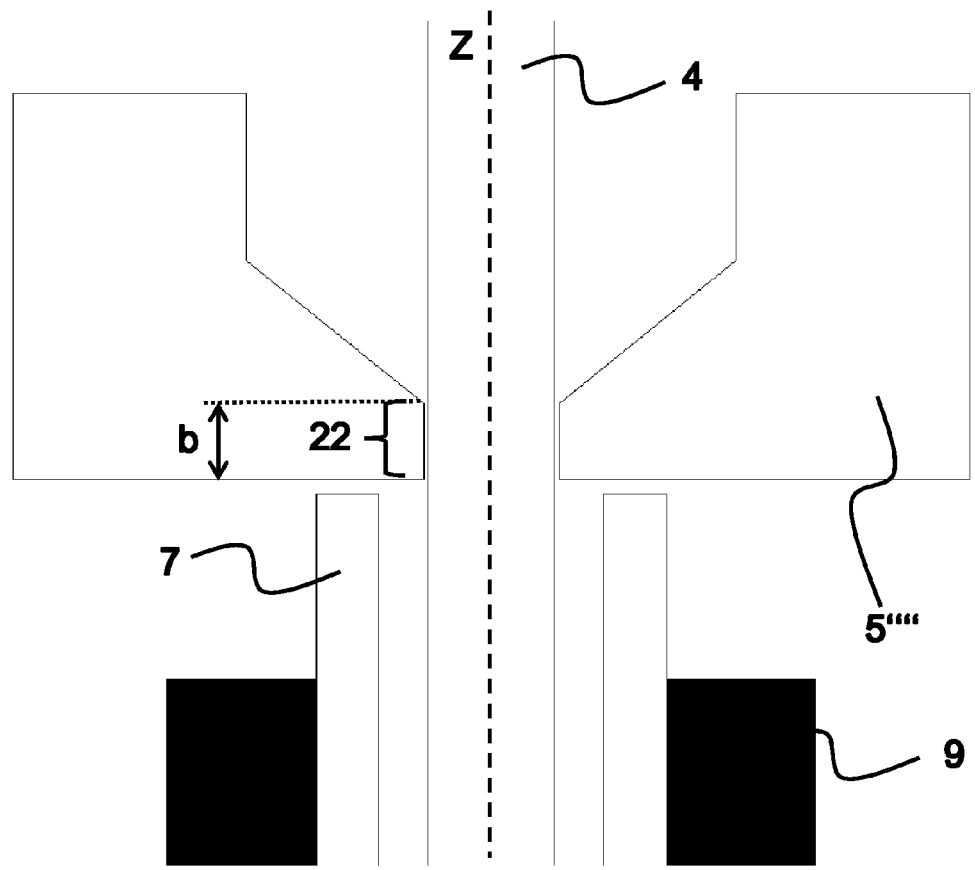
FIG. 11 the region of the centering device that can touch the sample vial in the measuring position.

Finally, FIG. 11 shows the region 22 of a centering device 5''', which can touch the sample vial 4 in the measuring position. This region 22 has the axial length b.

LIST Of REFERENCE SYMBOLS:

(1) Turbine
(2) Spinner
(3) NMR probe head with outside diameter D
(4) Sample vial
(5;5';5'';5''') First centering device, axially above the NMR coil system
(6; 6') Further centering device, axially above the NMR coil system and at an axial distance d from the first centering device
(5*a*) Third centering device with axial spacing between the first and further centering device
(7) Predefined hollow cylindrical ("endangered") space
(8) Further centering device, axially below the NMR coil system
(9; 9') NMR coil system
(11) End stop part for the sample vial in its operating position
(12,13;14,15) Connecting elements
(16; 16') Radially inner guide
(17) Cylindrical coil holder glass
(18) Cylindrical tube, preferably acting as RF shielding
(19) Upper edge of the end stop
(20) Cams, raised in the radial direction
(21) Slots, extending along the z direction
(22) Region of a guidance facility that can touch the sample vial in the measuring position
(d) Axial spacing between the first and further centering device
(b) Axial length of the region 22

LIST OF REFERENCES

[1] M. Warden, R. Seydoux, D. Marek: U.S. Pat. No. 6,563,317 B2; EP 1 239 296 B1; DE 101 11 672 C2
[2] D. Marek: U.S. Pat. No. 6,466,019 B2; EP 1 124 137 B1; DE 100 06 324 C1
[3] K. Nagao; K. Nakagawa: U.S. Pat. No. 3,525,928
[4] B. Grossniklaus, F. Raffa, M. Mayer, D. Wilhelm: US 2011/0284192 A1; EP 2 388 609 A1; DE 102 01 0029 080 B4

We claim:

1. An NMR probe head for analyzing a substance to be measured, the substance being disposed in a longitudinal sample vial closed at one end and filled with that substance, the probe head comprising:
   an NMR coil system disposed around a vertical z axis, the NMR coil system being fixed radially, with respect to the z axis, relative to the NMR probe head;
   a first centering device for radially centering the sample vial relative to the z axis, said first centering device having a first passage opening for the sample vial that centers the sample vial in a radial direction only, wherein, in a z direction, said first centering device is disposed above said NMR coil system and is radially fixed with respect to the z axis; and
   at least one second centering device, said second centering device having a second passage opening for the sample vial that centers the sample vial in the radial direction only, said second centering device being disposed axially above the NMR coil system and spaced apart from said first centering device in an axial direction of the z axis by an axial spacing with respect to the z axis, said axial spacing being selected and sizes as well as geometric shapes of said first and said second passage openings being designed such that, during an entire duration of transport of the sample vial into a measuring position in the NMR probe head, said first centering device and said second centering device cooperate with the sample vial to restrict a radial scope for movement of the sample vial relative to the z axis to such an extent that the sample vial cannot touch a predefined hollow cylindrical space, which extends axially with respect to the z axis in a region of said NMR coil system, which extends above and/or below said NMR coil system and which at least partially extends radially within said NMR coil system, wherein said second centering device is mechanically connected to the NMR Probe head and a radially innermost NMR coil of said NMR coil system and/or a holder structure for said innermost NMR coil is/are disposed in said hollow cylindrical space, wherein said holder structure for said innermost NMR coil is disposed in said hollow cylindrical space, and at least part of said first centering device extends radially between said holder structure and the sample vial in a measuring position thereof.

2. The NMR probe head of claim 1, wherein a cylindrical tube is disposed in said hollow cylindrical space and surrounds the sample vial in a measuring position thereof.

3. The NMR probe head of claim 1, wherein a cross section of at least one of said first and said second centering devices is geometrically designed such that a temperature-control gas can flow between the sample vial in a measuring position thereof and said first and second centering devices, wherein a temperature-control gas flow through said first and said second centering devices is blocked by no more than 70% in total, as viewed in a cross-sectional plane perpendicular to the z axis.

4. The NMR probe head of claim 1, wherein said first centering device comprises a radial inner guide, a cylindrical tube preferably acting as RF shielding and an upper end stop edge adapted to rest on an upper end face of a cylindrical coil glass.

5. The NMR probe head of claim 1, wherein said first centering device comprises a radial inner guide having multiple radial cutouts extending along the z axis in the axial direction and/or has slots disposed along the z direction.

6. The NMR probe head of claim 5, wherein cams, raised in the radial direction, are provided on bars between said slots, said cams being dimensioned in such a way that said first centering device is clamped in the radial direction when inserted into said holder structure for said radially innermost NMR coil of the NMR coil system.

7. The NMR probe head of claim 1, further comprising a third centering device disposed with axial spacing In the z direction above said first centering device and below said second centering device.

8. The NMR probe head of claim 1, further comprising a third centering device disposed axially below said NMR coil system.

9. The NMR probe head claim 1, further comprising at least one positioning device for axially positioning the sample vial, which, in the measuring position, is disposed below or above said NMR coil system.

10. The NMR probe head of claim 9, wherein said positioning device is disposed axially below said NMR coil system and comprises an end stop part on which the sample vial rests in an operating position thereof.

11. The NMR probe head of claim 1, wherein said first and second centering devices and are mechanically rigidly connected to each other and/or to a holder structure for said NMR coil system.

12. The NMR probe head of claim 1, wherein at least one of said first and second centering devices has a funnel-shaped passage opening to receive the sample vial.

13. The NMR probe head of claim 1, wherein at least one of said first and second centering devices is designed in such a way that a region thereof that can touch the sample vial in the measuring position has an axial extent of 0.05 D to 0.6 D, wherein D Is a radial diameter of the sample vial.

14. The NMR probe head of claim 1, wherein at least one of said first and second centering devices consists of a material, which has a hardness that is less than a hardness of materials from which the sample vial is manufactured, less than a hardness of borosilicate glass or less than a hardness of fused silica.

15. The NMR probe head of claim 1, wherein at least one of said first and second centering devices consists of a material that has a conductivity of $<10^{-8}$ S/m.

16. The NMR probe head of claim 1, wherein at least one of said first and second centering devices consists of a material that has a magnetic susceptibility of <1.0 ppm.

17. The NMR probe head of claim 1, wherein a temperature-control gas flowing around the sample vial in at least one of said first and second centering devices does not flow between said respective first or second centering device and the sample vial, rather is guided through air outlet holes offset radially away from the z axis.

18. The NMR measurement configuration having the NMR probe head of claim 1, with an NMR magnet system, a shimming system, a turbine, and a device for transporting the sample vial from outside the NMR magnet system into a measuring position of the sample vial in said NMR probe head.

19. An NMR probe head for analyzing a substance to be measured, the substance being disposed in a longitudinal sample vial closed at one end and filled with that substance, the probe head comprising:
   an NMR coil system disposed around a vertical z axis, the NMR coil system being fixed radially, with respect to the z axis, relative to the NMR probe head;
   a first centering device for radially centering the sample vial relative to the z axis, said first centering device having a first passage opening for the sample vial that centers the sample vial in a radial direction only, wherein, in a z direction, said first centering device is disposed above said NMR coil system and is radially fixed with respect to the z axis; and
   at least one second centering device, said second centering device having a second passage opening for the sample vial that centers the sample vial in the radial direction only, said second centering device being disposed axially above the NMR coil system and spaced apart from said first centering device in an axial direction of the z axis by an axial spacing with respect to the z axis, said axial spacing being selected and sizes as well as geometric shapes of said first and said second passage openings being designed such that, during an entire duration of transport of the sample vial into a measuring position in the NMR probe head, said first centering device and said second centering device cooperate with the sample vial to restrict a radial scope for movement of the sample vial relative to the z axis to such an extent that the sample vial cannot touch a predefined hollow cylindrical space, which extends axially with respect to the z axis in a region of said NMR coil system, which extends above and/or below said NMR coil system and which at least partially extends radially within said NMR coil system, wherein said second centering device is mechanically connected to the NMR probe head, wherein at least one of said first and second centering devices consists of a material whose surface has a conductivity of $>10^7$S/m.

20. The NMR probe head of claim 19, wherein at least one of said first and second centering devices has an axial length of at least one radial diameter of the sample vial and is positioned at an axial distance from an innermost NMR coil of said NMR coil system which is smaller than a radial coil diameter of said innermost NMR coil.

21. The NMR probe head of claim 19, wherein at least one of said first and second centering device makes RF electrical contact with an RF shielding tube of the NMR probe head.

22. The NMR probe head of claim 19, wherein at least one of said first and second centering devices is shaped such that, no path exists that surrounds the sample vial when in a measuring position thereof.

23. An NMR probe head for analyzing a substance to be measured, the substance being disposed in a longitudinal sample vial closed at one end and filled with that substance, the probe head comprising:
   an NMR coil system disposed around a vertical z axis, the NMR coil system being fixed radially, with respect to the z axis, relative to the NMR probe head;
   a first centering device for radially centering the sample vial relative to the z axis, said first centering device having a first passage opening for the sample vial that centers the sample vial in a radial direction only, wherein, in a z direction, said first centering device is disposed above said NMR coil system and is radially fixed with respect to the z axis; and
   at least one second centering device, said second centering device having a second passage opening for the sample vial that centers the sample vial in the radial direction only, said second centering device being disposed axially above the NMR coil system and spaced apart from said first centering device in an axial direction of the z axis by an axial spacing with respect to the z axis, said axial spacing being selected and sizes as well as geometric shapes of said first and said second passage openings being designed such that, during an entire duration of transport of the sample vial into a measuring position in the NMR probe head, said first centering device and said second centering device cooperate with the sample vial to restrict a radial scope for movement of the sample vial relative to the z axis to such an extent that the sample vial cannot touch a predefined hollow cylindrical space, which extends axially with respect to the z axis in a region of said NMR coil system, which extends above and/or below said NMR coil system and which at least partially extends radially within said NMR coil system, wherein said second centering device is mechanically connected to the NMR probe head, wherein an axial spacing between said first centering device and a radially innermost NMR coil of said NMR coil system is smaller than twice a radial diameter of the sample vial.

* * * * *